United States Patent
Nagashima

(10) Patent No.: US 9,466,606 B2
(45) Date of Patent: Oct. 11, 2016

(54) SEMICONDUCTOR STORAGE DEVICE

(71) Applicant: KABUSHIKI KAISHA TOSHIBA, Minato-ku (JP)

(72) Inventor: Satoshi Nagashima, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/807,352

(22) Filed: Jul. 23, 2015

(65) Prior Publication Data

US 2016/0268277 A1    Sep. 15, 2016

Related U.S. Application Data

(60) Provisional application No. 62/130,370, filed on Mar. 9, 2015.

(51) Int. Cl.
*H01L 29/76* (2006.01)
*H01L 27/115* (2006.01)
*H01L 29/423* (2006.01)
*H01L 21/28* (2006.01)

(52) U.S. Cl.
CPC ... *H01L 27/11556* (2013.01); *H01L 21/28273* (2013.01); *H01L 21/28282* (2013.01); *H01L 27/11582* (2013.01); *H01L 29/4234* (2013.01); *H01L 29/42324* (2013.01)

(58) Field of Classification Search
CPC ............. H01L 29/76; H01L 29/42344; H01L 29/4916; H01L 27/11582; H01L 27/11565
See application file for complete search history.

(56) References Cited

U.S. PATENT DOCUMENTS

| | | | |
|---|---|---|---|
| 6,157,061 A | 12/2000 | Kawata | |
| 8,674,426 B2 | 3/2014 | Higuchi et al. | |
| 2010/0090286 A1* | 4/2010 | Lee | H01L 27/11526 257/368 |
| 2010/0171162 A1* | 7/2010 | Katsumata | H01L 27/0688 257/314 |
| 2011/0286275 A1* | 11/2011 | Jeon | G11C 16/0483 365/185.17 |
| 2013/0056818 A1* | 3/2013 | Iino | H01L 27/1157 257/324 |
| 2014/0126290 A1* | 5/2014 | Sakui | H01L 29/7889 365/185.05 |
| 2014/0209853 A1 | 7/2014 | Yamato et al. | |
| 2015/0179660 A1* | 6/2015 | Yada | H01L 21/02164 257/321 |
| 2015/0200199 A1 | 7/2015 | Sakamoto et al. | |

FOREIGN PATENT DOCUMENTS

| | | |
|---|---|---|
| JP | 3425853 | 7/2003 |
| JP | 2011-165815 | 8/2011 |

* cited by examiner

*Primary Examiner* — Phuc Dang
(74) *Attorney, Agent, or Firm* — Oblon, McClelland, Maier & Neustadt, L.L.P.

(57) ABSTRACT

A semiconductor storage device according to an embodiment comprises stacks comprising insulating films and first wires that are alternately stacked. Semiconductor parts are provided in the stacks. The longitudinal direction of the semiconductor parts is a stacking direction of the insulating films and the first wires. Charge accumulation layers are provided between the first wires and the semiconductor parts and a plurality of the charge accumulation layers are provided corresponding to one of the semiconductor parts in a cross-section in a direction perpendicular to the longitudinal direction of the semiconductor parts. A width of first side surfaces of the semiconductor parts on which the charge accumulation layers are provided is larger at bottom ends of the semiconductor parts than at top ends of the semiconductor parts.

11 Claims, 10 Drawing Sheets

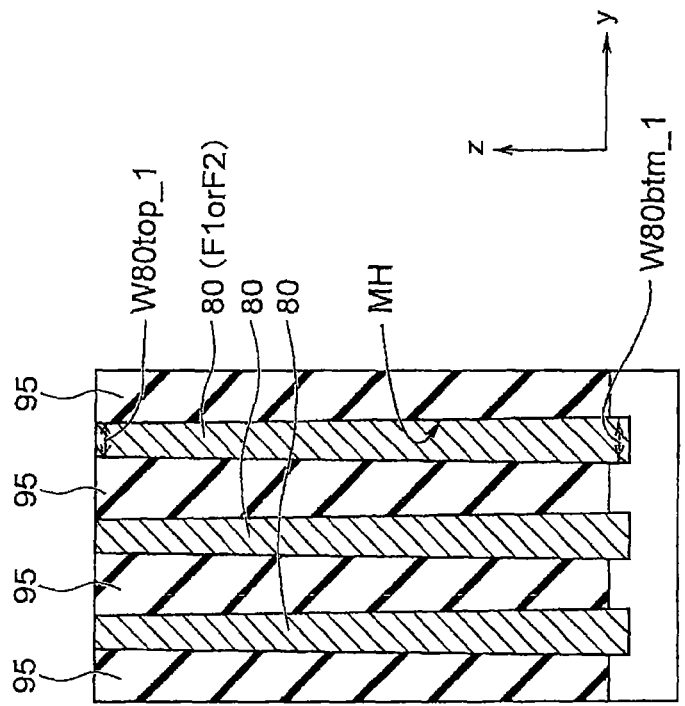
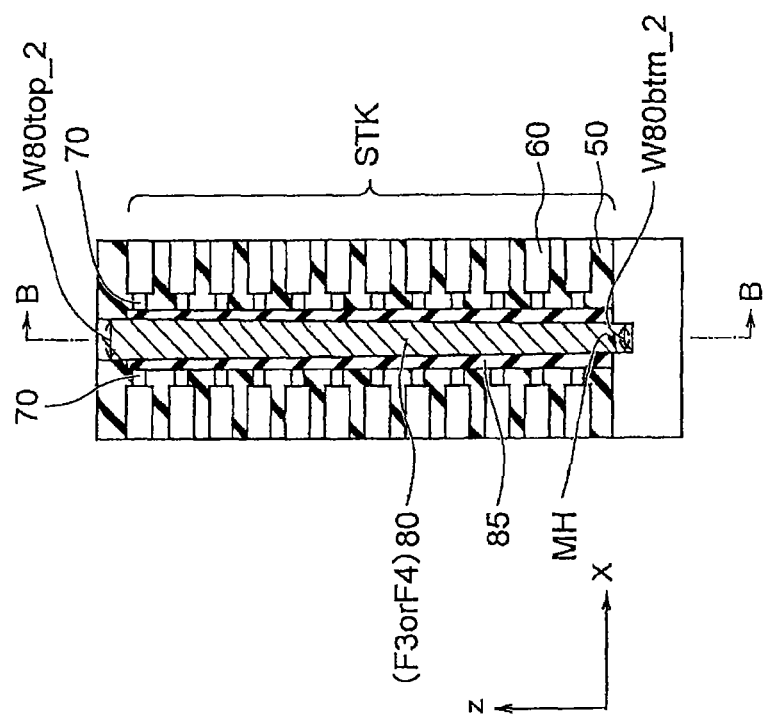
FIG.4A
FIG.4B

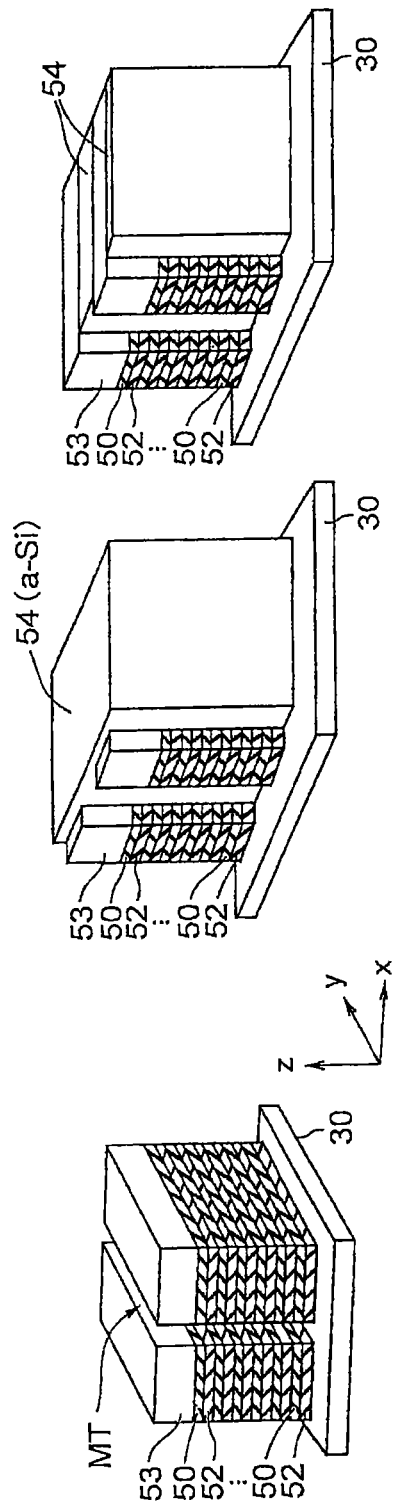

SEMICONDUCTOR STORAGE DEVICE

CROSS REFERENCE TO RELATED APPLICATIONS

This application is based upon and claims the benefit of priority from the prior U.S. Provisional Patent Application No. 62/130,370, filed on Mar. 9, 2015, the entire contents of which are incorporated herein by reference.

FIELD

The embodiments of the present invention relate to a semiconductor storage device and a manufacturing method thereof.

BACKGROUND

A stacked memory has been developed as a nonvolatile semiconductor storage device. Division of a charge accumulation layer and a control electrode formed on side surfaces of one semiconductor pillar into plural pieces in a cross-section perpendicular to a stacking direction of a stack of insulating films and control electrode films is studied to improve an integration degree of the stacked memory. These charge accumulation layers and control electrodes are formed by cross-point processing. In the cross-point processing, after a plurality of trenches are formed in a stack, a plurality of shallow trench isolation films that perpendicularly intersect with an extending direction of the trenches are formed. Memory holes are formed at cross-points between gaps between adjacent ones of the shallow trench isolation films and the trenches, respectively. The charge accumulation layers and the control electrodes are formed on both sides of exposed portions of the stack in the memory holes.

However, the shallow trench isolation films used in the cross-point processing are, for example, insulating films such as a silicon dioxide film and etching thereof produces many depositions. Therefore, a process conversion difference is large and the memory holes become wide at top ends and narrow at bottom ends when the shallow trench isolation films are processed. In this case, a gate area (a gate width×a gate length) of a memory cell and the threshold voltage thereof vary according to the position of the memory cell in the stacking direction. This leads to variation in a write voltage or an erase voltage. Furthermore, a cross-sectional area of the semiconductor pillars formed in the memory holes also becomes large at top portions and small at bottom portions. Therefore, cell currents in memory cells at the bottom portions of the semiconductor pillars are adversely reduced.

BRIEF DESCRIPTION OF THE DRAWINGS

FIGS. 4A and 4B are cross-sectional views of the semiconductor pillar 80 and a peripheral part thereof;

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate or a semiconductor layer on which semiconductor elements are provided is assumed as "an upper direction". Therefore, the term "upper direction" or "lower direction" occasionally differs from an upper direction or a lower direction based on a gravitational acceleration direction.

A semiconductor storage device according to an embodiment comprises stacks comprising insulating films and first wires that are alternately stacked. Semiconductor parts are provided in the stacks. The longitudinal direction of the semiconductor parts is a stacking direction of the insulating films and the first wires. Charge accumulation layers are provided between the first wires and the semiconductor parts and a plurality of the charge accumulation layers are provided corresponding to one of the semiconductor parts in a cross-section in a direction perpendicular to the longitudinal direction of the semiconductor parts. A width of first side surfaces of the semiconductor parts on which the charge accumulation layers are provided is larger at bottom ends of the semiconductor parts than at top ends of the semiconductor parts.

First Embodiment

Figure 1:
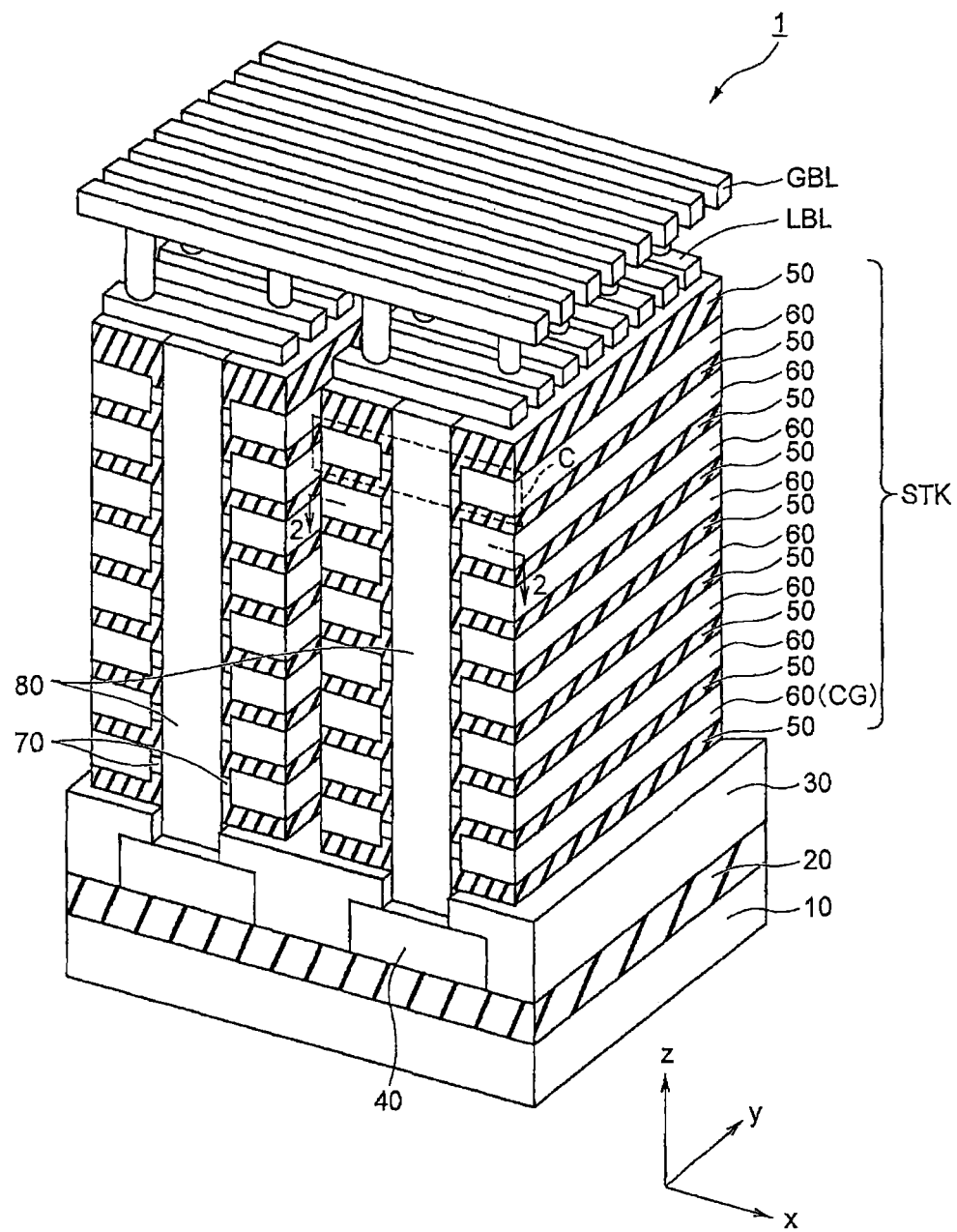
FIG. 1 is a perspective view showing an example of a configuration of a semiconductor storage device 1 according to a first embodiment.

FIG. 1 is a perspective view showing an example of a configuration of a semiconductor storage device 1 (hereinafter, also simply "device 1") according to a first embodiment. The device 1 includes a substrate 10, an insulating film 20, a semiconductor layer 30, diffusion layers 40, stacks STK, charge accumulation layers 70, semiconductor pillars 80, local bit lines LBL, and global bit lines GBL. While the device 1 includes both of the local bit lines LBL and the global bit lines GBL in the present embodiment, the device 1 can include either the local bit lines LBL or the global bit lines GBL.

The substrate 10 is a semiconductor substrate such as a silicon substrate. The insulating film 20 is an insulating film such as a silicon dioxide film. The semiconductor layer 30 is a semiconductor material such as silicon. The substrate 10, the insulating film 20, and the semiconductor layer 30 can be, for example, a SOI (Silicon On Insulator) substrate.

The stacks STK are stacked films formed by stacking insulating films 50 and word lines 60 alternately in a direction z. The direction z is a direction perpendicular to a surface (an x-y plane) of the substrate 10 or the semiconductor layer 30 and is a stacking direction of the insulating films 50 and the word lines 60. The insulating films 50 are insulating films such as silicon dioxide films. The word lines 60 serving as first wires are conductive metals such as tungsten or TiN. The word lines 60 extend in a direction y on the surface of the semiconductor layer 30 and also function as control electrodes CG of memory cells.

The semiconductor pillars 80 serving as semiconductor parts extend in the stacks STK in the stacking direction (the direction z) of the insulating films 50 and the word lines 60. That is, a longitudinal direction of the semiconductor pillars 80 is the stacking direction (the direction z) of the insulating films 50 and the word lines 60. The semiconductor pillars 80 penetrate through the stacks STK and bottom portions of the semiconductor pillars 80 are electrically connected to the diffusion layers 40 provided in the semiconductor layer 30. Top portions of the semiconductor pillars 80 are electrically connected to the local bit lines LBL. A conductive material such as doped polysilicon is used for the semiconductor pillars 80.

The diffusion layers 40 are provided in the semiconductor layer 30 and function as source layers.

The local bit lines LBL serving as second wires are provided to extend in a direction x on the stacks STK. The direction x is a direction perpendicular to the direction y on the surface of the substrate 10 or the semiconductor layer 30. The semiconductor pillars 80 are provided to correspond to the local bit lines LBL, respectively. Therefore, a plurality of the local bit lines LBL adjacent in the direction y are connected to different ones of the semiconductor pillars 80, respectively. A plurality of the local bit lines LBL adjacent in the direction x are connected to a common global bit line GBL.

The global bit lines GBL serving as the second wires extend in the direction x. The global bit lines GBL and the local bit lines LBL are formed of a low-resistance metal such as tungsten or copper. It is possible to provide only the global bit lines GBL without the local bit lines LBL. In this case, the second wires correspond to the global bit lines GBL.

The charge accumulation layers 70 are provided between the semiconductor pillars 80 and the word lines 60, respectively. A configuration of the charge accumulation layers 70 is explained later with reference to FIGS. 2 and 3.

An interlayer dielectric film (not shown) is further provided in gaps between adjacent ones of the stacks STK, gaps between adjacent ones of the global bit lines GBL, and gaps between adjacent ones of the local bit lines LBL.

Figure 2:
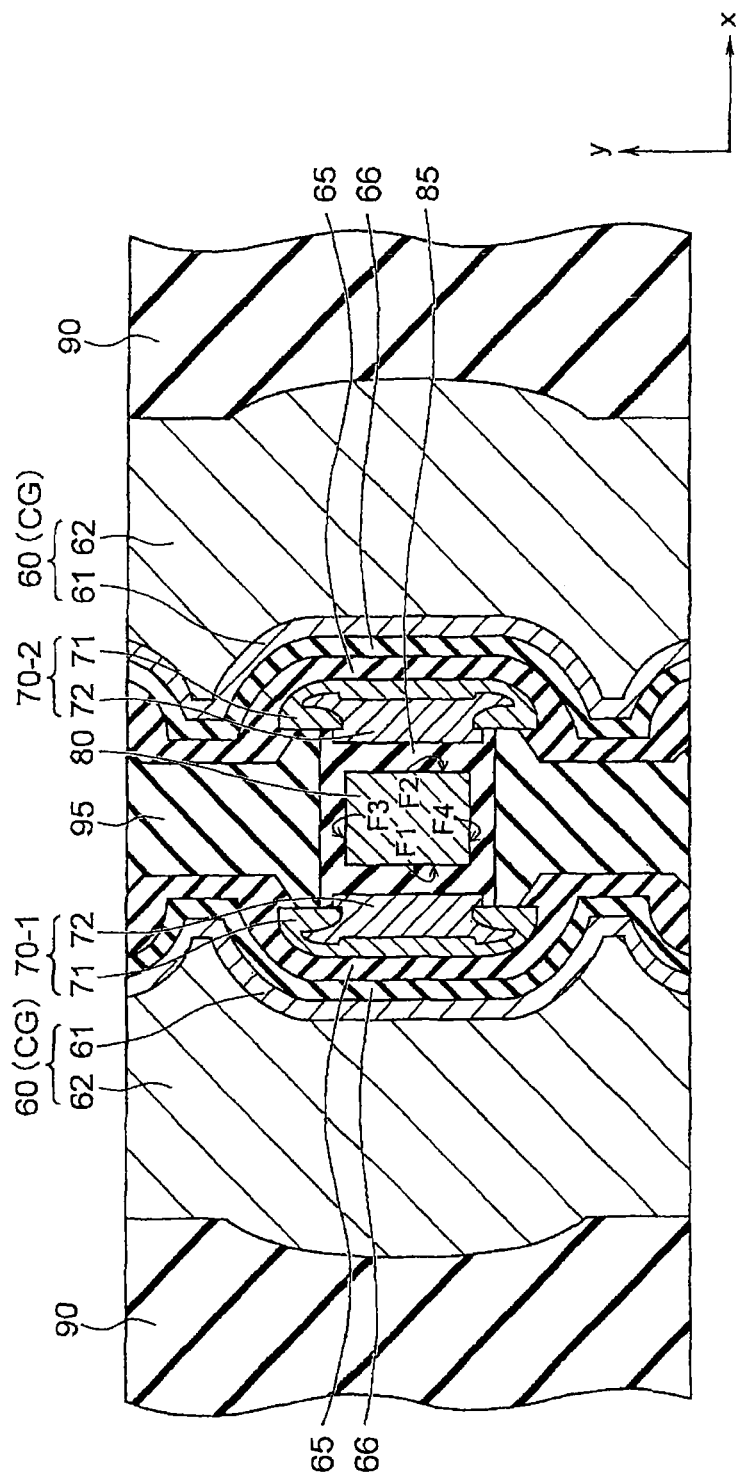
FIG. 2 is a schematic cross-sectional view along a line 2-2 in FIG. 1.
Figure 3:
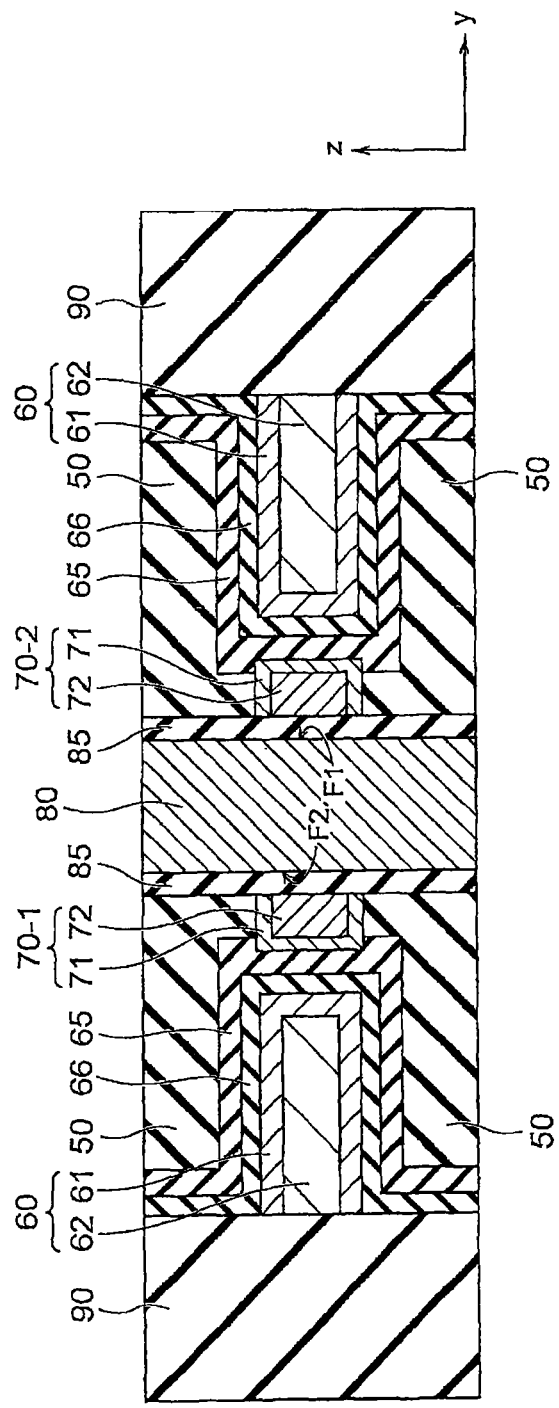
FIG. 3 is a schematic cross-sectional view of a portion in a broken line frame C in FIG. 1.

FIG. 2 is a schematic cross-sectional view along a line 2-2 in FIG. 1. That is, FIG. 2 illustrates a cross-section in a direction perpendicular to the extending direction or the longitudinal direction (the direction z) of the semiconductor pillars 80 (a cross-section cut along a plane substantially parallel to the surface of the semiconductor layer 30). FIG. 3 is a schematic cross-sectional view of a portion in a broken line frame C in FIG. 1. That is, FIG. 3 illustrates a cross-section in a direction perpendicular to the extending direction or the longitudinal direction (the direction y) of the word lines 60. FIGS. 2 and 3 illustrate cross-sections of two memory cells adjacent in the direction x.

As shown in FIG. 2, a plurality of charge accumulation layers 70_1 and 70_2 are provided for one semiconductor pillar 80 in a cross-section in a direction perpendicular to the direction z. In the present embodiment, the semiconductor pillars 80 have a substantially rectangular shape in a cross-section substantially orthogonal to the direction z. The two charge accumulation layers 70_1 and 70_2 are provided to correspond to two facing first side surfaces F1 and F2, respectively, among side surfaces of one semiconductor pillar 80. The first side surfaces F1 and F2 are side surfaces substantially orthogonal to the direction x. The charge accumulation layer 70_1 is provided to face the first side surface F1 with a tunnel dielectric film 85 interposed therebetween. The charge accumulation layer 70_2 is provided to face the first side surface F2 with the tunnel dielectric film 85 interposed therebetween.

As shown in FIG. 3, the semiconductor pillar 80 extends in the direction z in a cross-section substantially orthogonal to the direction y. The charge accumulation layer 70_1 is provided between the first side surface F1 of the semiconductor pillar 80 and a word line 60. The charge accumulation layer 70_2 is provided between the first side surface F2 of the semiconductor pillar 80 and another word line 60. The charge accumulation layers 70_1 and 70_2 are provided to correspond to different word lines 60, respectively. A plurality of the charge accumulation layers 70_1 (or 70_2) adjacent in the direction z are electrically isolated from each other by the insulating films 50, respectively.

In this way, the charge accumulation layers 70_1 and 70_2 are electrically isolated from each other. The charge accumulation layers 70_1 (or 70_2) adjacent in the direction z are also electrically isolated from each other. Accordingly, the charge accumulation layers 70_1 and 70_2 are included in different memory cells, respectively, and can accumulate or emit charges individually.

The charge accumulation layer 70_1 has a two-layer structure including a first accumulation film 71 and a second accumulation film 72. The first accumulation film 71 is provided on the side of intergate dielectric films 65 and 66 and is formed of, for example, a high dielectric film such as SiN, HfSiO, or HfSiON or a stacked film including a high dielectric film containing metal, and the like. The second accumulation film 72 is provided on the side of the semiconductor pillar 80 and is formed of, for example, a semiconductor material such as polysilicon. The charge accumulation layer 70_2 can have the same configuration as that of the charge accumulation layer 70_1.

As shown in FIG. 2, shallow trench isolation (STI) films 95 are provided on two facing second side surfaces F3 and F4, respectively, among the side surfaces of the semiconductor pillar 80 with the tunnel dielectric film 85 interposed therebetween. The second side surfaces F3 and F4 are side surfaces substantially orthogonal to the direction y. The STI films 95 are interposed between the charge accumulation layer 70_1 and the charge accumulation layer 70_2 and electrically isolate the charge accumulation layers 70_1 and 70_2 from each other.

The intergate dielectric films 65 and 66 are provided on side surfaces of the charge accumulation layers 70_1 and 70_2. In the present embodiment, the intergate dielectric films 65 and 66 are stacked films of a plurality of insulating films, respectively. A silicon dioxide film or a high dielectric material having a higher dielectric constant than that of the silicon dioxide film is used for the intergate dielectric films 65 and 66. The intergate dielectric film 65 is, for example, a silicon dioxide film and the intergate dielectric film 66 is formed of, for example, a high dielectric film such as SiN, HfSiO, or HfSiON or a high dielectric film containing metal.

The word lines 60 are provided on side surfaces of the intergate dielectric films 65 and 66. In the present embodiment, the word lines 60 are stacked films of a plurality of conductive films 61 and 62, respectively. A low-resistance material such as metal or a metallic compound is used for the conductive films 61 and 62. The conductive film 61 is, for example, titanium nitride (TiN) and the conductive film 62 is, for example, tungsten.

As shown in FIGS. 1 and 2, the word lines 60 extend in the direction y and are used commonly for pluralities of the charge accumulation layers 70_1 (or 70_2) arrayed in the direction y, respectively. Meanwhile, as shown in FIGS. 1 and 3, the word lines 60 are adjacent to the insulating films 50 in the direction z and are electrically isolated from other word lines 60 adjacent in the direction z, respectively.

As shown in FIGS. 2 and 3, interlayer dielectric films 90 are provided on side surfaces of the word lines 60, respectively. The interlayer dielectric films 90 are provided between the stacks STK adjacent in the direction x and electrically isolate the word lines 60 adjacent in the direction x from each other. The interlayer dielectric film 90 is formed of, for example, an insulating film such as a silicon dioxide film. The interlayer dielectric film 90 can be a low dielectric material having a lower dielectric constant than that of the silicon dioxide film. The interlayer dielectric film 90 can be a porous material or can have air gaps.

FIGS. 4A and 4B are cross-sectional views of the semiconductor pillar 80 and a peripheral part thereof. FIG. 4A illustrates a cross-section in a direction perpendicular to the direction y (a cross-section in a direction perpendicular to the extending direction or the longitudinal direction of the word lines 60). Therefore, in FIG. 4A, the width of the second side surface F3 or F4 of the semiconductor pillar 80 is shown. FIG. 4B illustrates a cross-section substantially orthogonal to the direction x (a cross-section in a direction perpendicular to the extending direction or the longitudinal direction of the bit lines BL). Therefore, in FIG. 4B, the width of the first side surface F1 or F2 of the semiconductor pillar 80 is shown. It can be said that FIG. 4B is a cross-section along a line B-B in FIG. 4A.

As shown in FIG. 4A, in the second side surface F3 or F4, the width of the semiconductor pillar 80 is smaller at a bottom end of the semiconductor pillar 80 than at a top end thereof. For example, a width W80btm_2 of a bottom end portion of the semiconductor pillar 80 is smaller than a width W80top_2 of a top end portion of the semiconductor pillar 80. That is, the width of the second side surfaces F3 and F4 of the semiconductor pillar 80 on which the charge accumulation layers 70 are not provided is smaller at the bottom end of the semiconductor pillar 80 than at the top end of the semiconductor pillar 80. In still other words, the semiconductor pillar 80 has such a tapered shape as to be narrower at the bottom end than at the top end in the cross-section in the direction perpendicular to the longitudinal direction (the direction y) of the word lines 60.

Similarly, the opening width of memory holes MH is also smaller at a bottom end of the memory holes MH than at a top end thereof in the cross-section in the direction perpendicular to the longitudinal direction (the direction y) of the word lines 60.

Meanwhile, as shown in FIG. 4B, the width of the semiconductor pillar 80 in the first side surface F1 or F2 is larger at the bottom end of the semiconductor pillar 80 than at the top end thereof. For example, a width W80btm_1 of the bottom end portion of the semiconductor pillar 80 is larger than a width W80top_1 of a top end portion of the semiconductor pillar 80. That is, the width of the first side surfaces F1 and F2 of the semiconductor pillar 80 on which the charge accumulation layers 70 are provided is larger at the bottom end of the semiconductor pillar 80 than at the top end thereof. In still other words, the semiconductor pillar 80 has such a tapered shape as to be wider at the bottom end than at the top end in a cross-section in a direction perpendicular to the longitudinal direction (the direction x) of the bit lines BL. Along with this configuration, the width (the width in the direction y) of the charge accumulation layers 70 is also larger at the bottom end of the semiconductor pillar 80 than at the top end thereof.

Similarly, the opening width of the memory holes MH is also larger at the bottom end of the memory holes MH than at the top end thereof in the cross-section in the direction perpendicular to the longitudinal direction (the direction x) of the bit lines BL.

Figure 5:
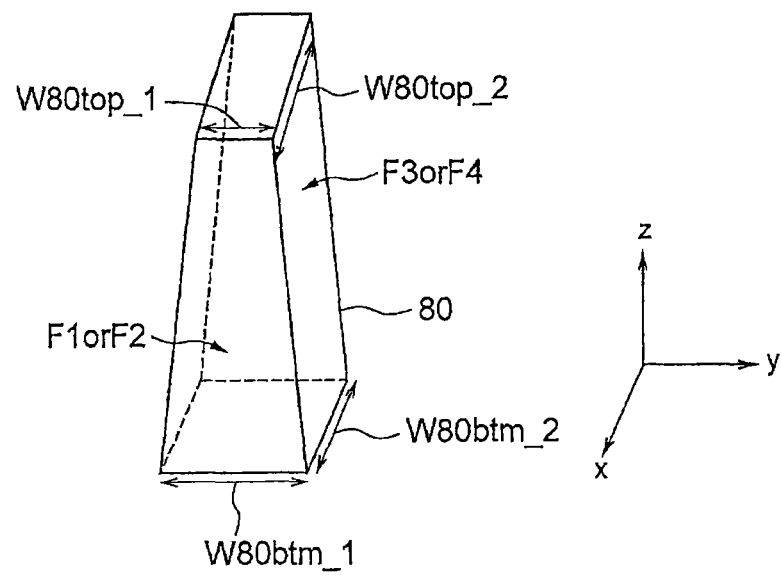
FIG. 5 is a schematic perspective view showing a shape of the semiconductor pillar 80.

FIG. 5 is a schematic perspective view showing a shape of the semiconductor pillar 80. As shown in FIG. 5, in the first side surface F1 or F2, the width W80btm_1 of the bottom end portion of the semiconductor pillar 80 is larger than the width W80top_1 of the top end portion of the semiconductor pillar 80. Meanwhile, in the second side surface F3 or F4, the width W80btm_2 of the bottom end portion of the semiconductor pillar 80 is smaller than the width W80top_2 of the top end portion of the semiconductor pillar 80. Therefore, in a cross-section in a direction perpendicular to the stacking direction (the direction z) of the stacks STK, the area of the top end portion of the semiconductor pillar 80 has only a little difference from that of the bottom end portion thereof. That is, in the cross-section in the direction perpendicular to the direction z, the cross-sectional area of the semiconductor pillar 80 can be substantially equalized regardless of positions in the semiconductor pillar 80 in the direction z. Accordingly, the resistance of the semiconductor pillar 80 can be substantially equalized regardless of the positions in the direction z. As a result, cell currents flowing in the memory cells can be substantially equalized regardless of positions of the memory cells in the direction z. By substantially equalizing the cell currents, threshold voltages of the memory cells can be stabilized. The threshold voltage in this case is a neutral threshold voltage at a time when charges are not accumulated.

Along with the shape of the first side surface F1 or F2, the width of the charge accumulation layer 70 and a gate width (a length of the gate in the direction y) are also larger at the bottom end portion of the semiconductor pillar 80 than at the top end portion of the semiconductor pillar 80. Therefore, the cell currents are larger at the bottom end portion of the semiconductor pillar 80 than at the top end portion of the semiconductor pillar 80. Accordingly, the threshold voltages of the memory cells are lower at the bottom end portion of the semiconductor pillar 80 than at the top end portion of the semiconductor pillar 80.

As described above, according to the present embodiment, the threshold voltages of the memory cells are lower at the bottom end portion of the semiconductor pillar 80 than at the top end portion of the semiconductor pillar 80 in view of the width of the charge accumulation layer 70 and the gate width (a gate area). However, in view of the cross-sectional area of the semiconductor pillar 80, the threshold voltages of the memory cells can be substantially equalized regardless of the positions in the semiconductor pillar 80 in the direction z.

Figure 6:
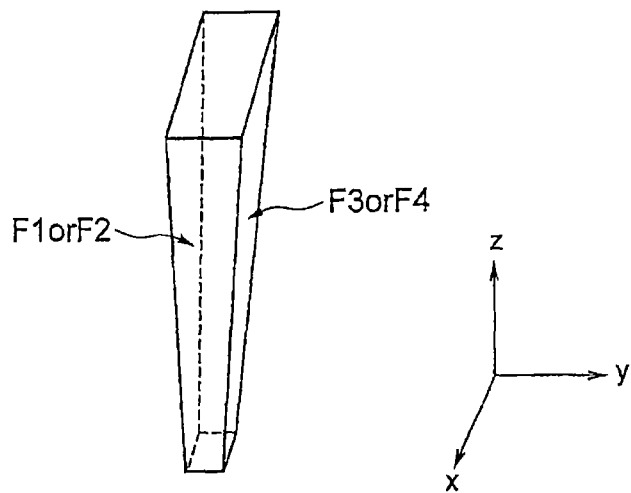
FIG. 6 is a schematic perspective view showing another shape of the semiconductor pillar.

On the other hand, for example, in FIG. 6, the width of the first side surface F1 or F2 of the semiconductor pillar 80 is smaller at the bottom end of the semiconductor pillar 80 than at the top end thereof similarly to the second side surface F3 or F4. In this case, the cell currents are smaller at the bottom end portion of the semiconductor pillar 80. This causes the threshold voltages of the memory cells to be higher at the bottom end portion of the semiconductor pillar 80. Furthermore, the width of the charge accumulation layer 70 and the gate width (the gate area) are smaller at the bottom end portion of the semiconductor pillar 80 than at the top end portion of the semiconductor pillar 80. This further reduces the cell currents at the bottom end portion of the semiconductor pillar 80. Therefore, the threshold voltages of the memory cells become quite high at the bottom end portion of the semiconductor pillar 80 relative to at the top end portion thereof. In this case, the threshold voltages of the memory cells vary greatly according to the positions in the semiconductor pillar 80 in the direction z.

Besides, when the opening area is small at the bottom end portion of the semiconductor pillar 80, the opening may become elliptical or circular at the bottom end portion of the semiconductor pillar 80, which may preclude formation of the tunnel dielectric film 85 or the charge accumulation layer 70.

On the other hand, the device 1 according to the present embodiment can substantially equalize the threshold voltages of the memory cells regardless of the positions in the semiconductor pillar 80 in the direction z at least in view of the cross-sectional area of the semiconductor pillar 80. Therefore, variation in the threshold voltages of the memory cells can be suppressed. Furthermore, because the opening area is relatively large at the bottom end portion of the semiconductor pillar 80, the memory cells can be formed reliably at the bottom end portion of the semiconductor pillar 80.

In FIG. 5, the respective sides of the first side surfaces F1 and F2 and the second side surfaces F3 and F4 can be straight lines or curved lines. When the respective sides of the first side surfaces F1 and F2 and the second side surfaces F3 and F4 are straight lines, the first side surfaces F1 and F2 and the second side surfaces F3 and F4 are substantially flat surfaces as shown in FIG. 5. Although not shown, when the respective sides of the first side surfaces F1 and F2 and the second side surfaces F3 and F4 are curved lines, the first side surfaces F1 and F2 and the second side surfaces F3 and F4 can be concave curved surfaces or convex curved surfaces.

In FIG. 5, the shapes of the first side surfaces F1 and F2 and the second side surfaces F3 and F4 of the semiconductor pillar 80 are shown exaggeratedly for convenience sake. Practically, inclinations of the first side surfaces F1 and F2 of the semiconductor pillar 80 from the direction z and inclinations of the second side surfaces F3 and F4 from the direction z can be small. In this case, the difference between the width W80btm_1 and the width W80top_1 is small and thus the width of the charge accumulation layer 70 and the gate width also have only little differences between the top end portion of the semiconductor pillar 80 and the bottom end portion thereof. Therefore, variation in the width of the charge accumulation layer 70 and the gate width can be practically reduced.

A manufacturing method of the device 1 according to the present embodiment is explained next.

FIGS. 7A to 8E are cross-sectional views showing an example of the manufacturing method of the device 1 according to the first embodiment.

First, the diffusion layers 40 (see FIG. 1) are formed in the semiconductor layer 30 and then the first insulating films 50 and second insulating films 52 are alternately stacked on the semiconductor layer 30 as shown in FIG. 7A. The first insulating films 50 are insulating films such as silicon dioxide films. The second insulating films 52 are insulating films such as silicon nitride films. The first insulating films 50 will remain later as the insulating films 50 between the word lines 60 adjacent in the direction z. The second insulating films 52 will be removed later to form the charge accumulation layers 70, the word lines 60, and the like. That is, the second insulating films 52 serve as sacrifice films. The second insulating films 52 are a material that can be removed selectively with respect to the first insulating films 50. For example, when the first insulating films 50 are silicon dioxide films, the second insulating films 52 are silicon nitride films.

Next, a material of a hard mask 53 is deposited on the stacked first and second insulating films 50 and 52. The material of the hard mask 53 is a material that can selectively etch the first and second insulating films 50 and 52 and is, for example, polysilicon.

Subsequently, the material of the hard mask 53 is processed into a layout pattern of memory trenches MT using a lithography technique and a RIE (Reactive Ion Etching) method. Next, the stacked first and second insulating films 50 and 52 are processed into the layout pattern of the memory tranches MT using the hard mask 53 as a mask. The memory trenches MT are thereby formed as shown in FIG. 7A. The memory trenches MT serving as first trenches are formed to reach the semiconductor layer 30 in the direction z and to extend in the direction y. The semiconductor pillars 80 will be formed later in the memory trenches MT. Therefore, a plurality of the memory trenches MT are arrayed at prescribed intervals in the direction x.

Next, as shown in FIG. 7B, a material of a sacrifice film 54 is deposited on the first and second insulating films 50 and 52 and in the memory trenches MT. The material of the sacrifice film 54 is a material that can be etched selectively with respect to the silicon dioxide film or the silicon nitride film and is also a material that does not generate so many reaction products during an etching process. For example, the material of the sacrifice film 54 is amorphous silicon. Accordingly, an STI region can be formed to have sufficiently large openings from top portions of stacks of the first and second insulating films 50 and 52 to bottom portions thereof in the etching process of the sacrifice film 54 as will be explained later.

Subsequently, the material of the sacrifice film 54 is etched back, thereby exposing the hard mask 53. A structure shown in FIG. 7C is thereby obtained.

Figure 7D:
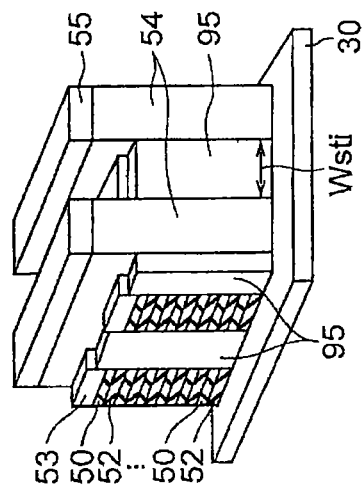
FIGS. 7A to 8E are cross-sectional views showing an example of the manufacturing method of the device 1 according to the first embodiment.

Next, materials of hard masks 55 and 56 are deposited on the hard mask 53 and the sacrifice film 54. The material of the hard mask 55 is, for example, a silicon dioxide film (such as BSG (Boron-Silicate Glass)) and the material of the hard mask 56 is, for example, a stacked film of a silicon dioxide film and carbon. Subsequently, a photoresist PR is formed on the materials of the hard masks 55 and 56 using the lithography technique to extend in the direction x substantially orthogonal to the extending direction or the longitudinal direction (a first direction, that is, the direction y) of the memory trenches MT. At that time, the photoresist PR is patterned to extend in the direction x across above the semiconductor pillars 80 formed in a later process. A structure shown in FIG. 7D is thereby obtained.

Figure 7E:
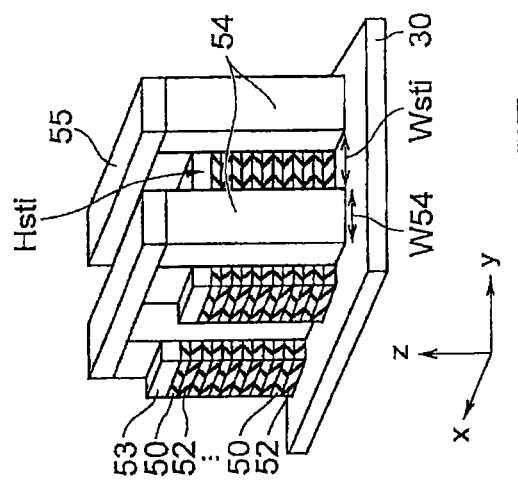

Next, the material of the hard mask 56 is processed by the RIE method using the photoresist PR as a mask. The material of the hard mask 55 is further processed by the RIE method using the hard mask 56 as a mask. The sacrifice film 54 is processed by the RIE method using the hard masks 55 and 53 as a mask. A plurality of the sacrifice films 54 are thereby processed to extend in the direction x (a second direction) across the top surfaces and the side surfaces of the first and second insulating films 50 and 52 as shown in FIG. 7E (cross-point processing). Regions in which the memory trenches MT and the sacrifice films 54 intersect with each other become active regions in which the semiconductor pillars 80 are formed, respectively. Therefore, the sacrifice films 54 are formed on the top surfaces and the side surfaces of the first and second insulating films 50 and 52 in the active regions in the memory trenches MT. Regions in the memory trenches MT other than the active regions become STI regions Hsti. The STI regions Hsti are formed as first holes formed by gaps between adjacent ones of the sacrifice films 54 and the memory trenches MT.

At that time, the sacrifice films 54 are formed of a material (such as amorphous silicon) that does not generate so many reaction products in the etching process. Therefore, a width (a width of the gap between the sacrifice films 54 adjacent in the direction y) Wsti of the STI regions Hsti can be formed to be sufficiently large at the top end portions and the bottom end portions in the direction z. The opening shape of the STI regions Hsti at the top end portions can be kept as it is at the bottom end portions. For example, when the opening shape of the STI regions Hsti at the top end portions is rectangular, the opening shape of the STI regions Hsti at the bottom end portions can be processed to keep the rectangular shape without being deformed to be elliptical or circular. That is, the processing conversion difference is small.

While not generating as many reaction products as a silicon dioxide film does, the sacrifice films 54 still generate some reaction products in the etching process. Therefore, the sacrifice films 54 after etching have a gently tapered shape so as to be slightly wider at the bottom end portion than at the top end portion in a cross-section in a direction perpendicular to the direction x. That is, a width W54 of the sacrifice films 54 in the direction y is slightly larger at the bottom end portions of the sacrifice films 54 than at the top end portions thereof. Therefore, while being formed to be sufficiently large at the bottom end portions, the opening width Wsti of the STI regions Hsti is slightly smaller at the bottom end portions than at the top end portions.

Figure 7F:
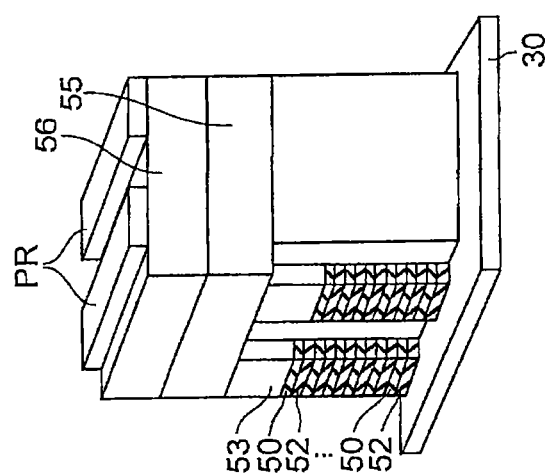

Subsequently, as shown in FIG. 7F, the STI film 95 is filled in the STI regions (first holes) Hsti in the memory trenches MT. The STI film 95 is, for example, an insulating film such as a silicon dioxide film (a TEOS (Tetraethylorthosilicate) film). At that time, the STI film 95 is formed in conformity with the shape of the STI regions Hsti. Therefore, while being formed to be sufficiently large at the bottom end portions, the width Wsti of the STI films 95 in the direction y is slightly smaller at the bottom end portions than at the top end portions. That is, the STI films 95 have a tapered shape so as to be slightly narrower at the bottom end portion than at the top end portion in the cross-section in the direction perpendicular to the direction x.

Figure 7G:
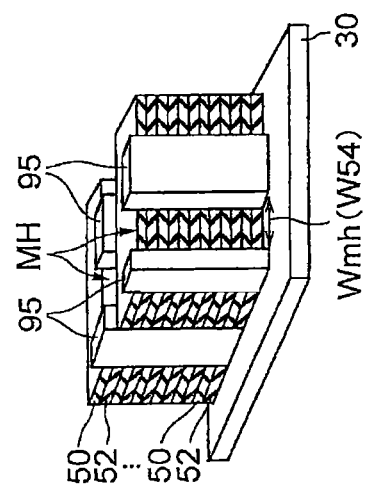
Figure 7H:
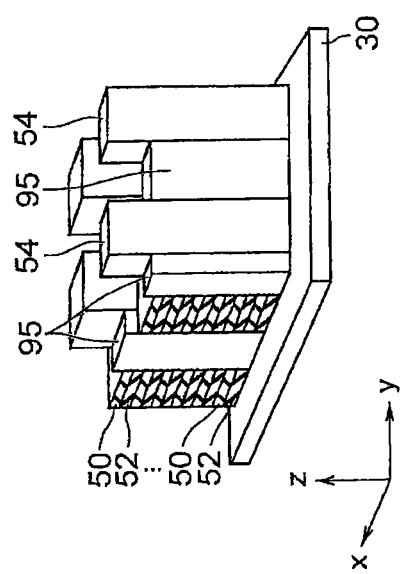

Next, the hard masks 53 and 55 are removed as shown in FIG. 7G and then the sacrifice films 54 are removed as shown in FIG. 7H. Due to removal of the sacrifice films 54, positions at which the sacrifice films 54 have been located become the memory holes HM, respectively. The memory holes MH serving as second holes are formed by gaps between adjacent ones of the STI films 95 and the memory trenches MT. Therefore, an opening width Wmh of the memory holes MH is processed to be slightly larger at the bottom end portions than at the top end portions, similarly to the width W54 of the sacrifice films 54, in the cross-section in the direction perpendicular to the direction x. That is, the opening width Wmh (the width in the direction y) of the memory holes MH is larger at the bottom end portions than at the top end portions.

In FIGS. 8A to 8E, the viewing direction and the scale are different from those in FIGS. 7B to 7H to facilitate understanding of formation of the memory cells. Nevertheless, FIGS. 8A to 8E are perspective views showing the manufacturing method of the device 1 following FIG. 7H.

Figure 8A:
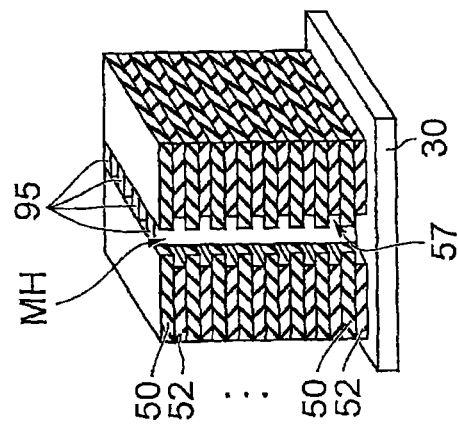

As shown in FIG. 8A, the second insulating films 52 are etched back through the memory holes MH. Accordingly, side surfaces of the second insulating films 52 are recessed with respect to side surfaces of the first insulating films 50 in the memory holes MH. Recesses 57 are formed on the side surfaces of the first and second insulating films 50 and 52.

Figure 8B:
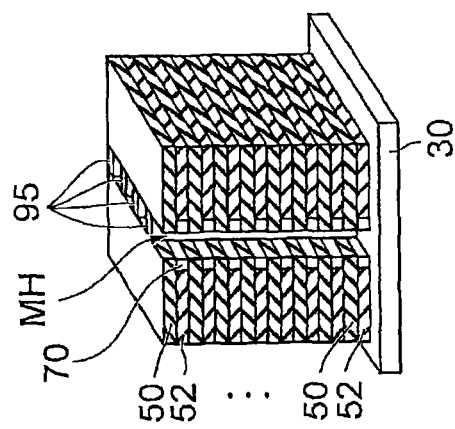

Next, a material of the charge accumulation layers 70 is deposited in the memory holes MH. Subsequently, the material of the charge accumulation layers 70 is etched back. The material of the charge accumulation layers 70 formed on the side surfaces of the first insulating films 50 is thereby removed while the charge accumulation layers 70 are left in the recesses 57 as shown in FIG. 8B. The charge accumulation layers 70 in the recesses 57 are electrically isolated from each other. As explained with reference to FIGS. 2 and 3, the charge accumulation layers 70 are formed of, for example, a high dielectric film such as SiN, HfSiO, or HfSiON or a stacked film including a high dielectric film containing metal, and the like as the first accumulation layer 71 and polysilicon as the second accumulation layer 72.

Figure 8C:
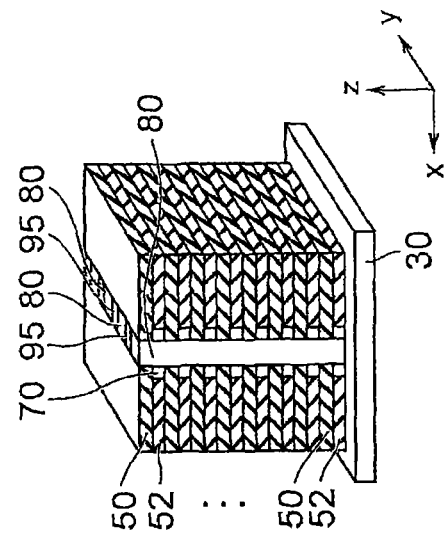

Subsequently, although not shown in FIG. 8C, the tunnel dielectric film 85 (see FIGS. 2 and 3) is formed on inner walls of the memory holes MH. Next, the semiconductor pillars 80 are filled in the memory holes MH, respectively. At that time, the shape of the semiconductor pillars 80 corresponds with the shape of the memory holes MH. Therefore, the width of the semiconductor pillars 80 in the direction y is larger at the bottom end portions than at the top end portions. Accordingly, the semiconductor pillars 80 have the shape explained with reference to FIG. 5.

Figure 8D:
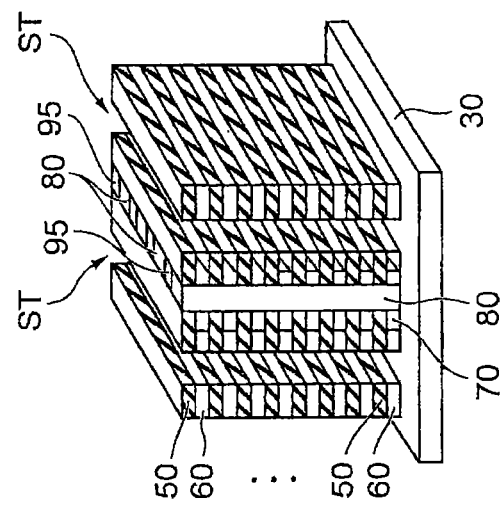

Subsequently, second trenches ST are formed using the lithography technique and the RIE method. The second trenches ST are formed in the first and second insulating films 50 and 52 between adjacent ones of the memory trenches MT to be substantially parallel to the memory trenches MT. Next, the second insulating films 52 exposed in the second trenches ST are removed to expose side surfaces of the charge accumulation layers 70. Recesses 58 are thereby formed between the first insulating films 50 adjacent in the direction z as shown in FIG. 8D.

Figure 8E:
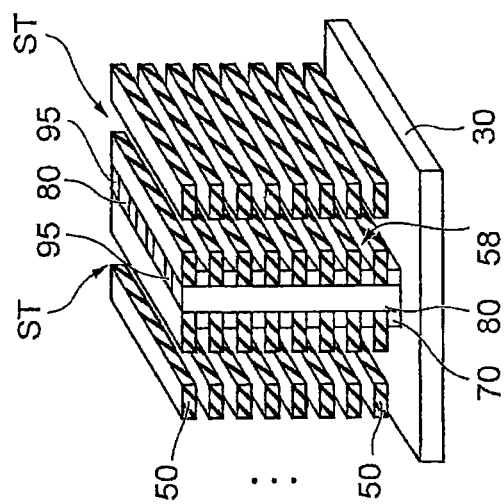

Subsequently, although not shown in FIG. 8E, the intergate dielectric films 65 and 66 (see FIGS. 2 and 3) are formed on the side surfaces of the charge accumulation layers 70 exposed in the second trenches ST. Further, as shown in FIG. 8E, a material of the word lines 60 is filled in the recesses 58. The intergate dielectric film 65 is an insulating film such as a silicon dioxide film and the intergate dielectric film 66 is a high dielectric film such as HfSiO. The material of the word lines 60 is, for example, titanium nitride (TiN) and tungsten. The material of the word lines 60 is etched back, thereby removing the material of the word lines 60 formed on the side surfaces of the first insulating films 50. Accordingly, the material of the word lines 60 is left in the recesses 58 and the word lines 60 in the recesses 58 are electrically isolated from each other. In this way, the word lines (control electrodes) 60 extending in the direction y are formed between the first insulating films 50 adjacent in the direction z. The first insulating films 50 and the word lines 60 become the stacks STK stacked on the semiconductor layer 30.

Next, the interlayer dielectric film 90 is filled in the second trenches ST. The local bit lines LBL, the global bit lines GBL, and the like are then formed, whereby the device 1 shown in FIG. 1 is completed.

According to the present embodiment, the regions of the semiconductor pillars 80 are previously determined using the sacrifice films 54 before formation of the STI films 95. Furthermore, the sacrifice films 54 are formed of a material that does not generate so many reaction products in the etching process. Therefore, the cross-sectional areas of the memory holes MH and the semiconductor pillars 80 are formed to be larger at the bottom end portions than at the top end portions. This provides reliable formation of the memory cells at the bottom end portions of the semiconductor pillars 80.

Furthermore, the cross-sectional areas of the semiconductor pillars 80 can be substantially equalized regardless of the positions in the direction z. Accordingly, variation of the cell currents in the direction z can be suppressed. As a result, variation of the threshold voltages depending on the positions of the memory cells can be suppressed.

(Modification)

Amorphous silicon is used as an example of the sacrifice films 54 in the embodiment described above. Meanwhile, a carbon film is used as the sacrifice films 54 in the present modification. In this case, the carbon film can be formed through SOC (Spin On Carbon) or using a conformal CVD (Chemical Vapor Deposition) method during formation of the sacrifice films 54 shown in FIG. 7B. The carbon film does not generate so many reaction products in the etching process, either. Therefore, even when the carbon film is used as the sacrifice films 54, effects identical to those in the above embodiment are achieved.

The carbon film formed by the method described above has a low heat resistance (for example, equal to or lower than 30° C.). Therefore, it is preferable that the hard mask 55 shown in FIG. 7D and the STI film 95 shown in FIG. 7G be low-temperature silicon dioxide films. The low-temperature silicon dioxide films can be formed, for example, through SOG (Spin On Glass) or LTO (Low Temperature Oxidation).

Other configurations and manufacturing processes of the present modification can be identical to corresponding configurations and manufacturing processes of the above embodiment. Therefore, the present modification can achieve effects identical to those in the above embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   stacks comprising insulating films and first wires alternately stacked;
   a conductive part provided in the stacks, a longitudinal direction of the conductive part being a stacking direction of the insulating films and the first wires; and
   memory cells between the first wires and the conductive part, a plurality of the memory cells being provided with the conductive part in a cross-section in a direction perpendicular to the longitudinal direction of the conductive part, wherein
   a width of first side surfaces of the conductive part on which the memory cells are provided is larger at a bottom end of the conductive part than at a top end of the conductive part, the width of the first side surfaces being a width in a longitudinal direction of the first wires, and
   a width of second side surfaces between the first side surfaces of the conductive part is smaller at the bottom end of the conductive part than at the top end of the conductive part, the width of the second side surfaces being a width in a direction intersecting with the longitudinal direction of the conductive part and the longitudinal direction of the first wires.

2. The device of claim 1, further comprising second wires electrically connected to the conductive part and provided in a direction intersecting with the first wires, wherein
   a width of the conductive part in a cross-section in a direction perpendicular to a longitudinal direction of the second wires is larger at the bottom end of the conductive part than at the top end of the conductive part.

3. The device of claim 2, wherein a width of the conductive part in a cross-section in a direction perpendicular to a longitudinal direction of the first wires is smaller at the bottom end of the conductive part than at the top end of the conductive part.

4. The device of claim 2, wherein the memory cells are not located on the second side surfaces of the conductive part.

5. The device of claim 1, wherein a width of the conductive part in a cross-section in a direction perpendicular to a longitudinal direction of the first wires is smaller at the bottom end of the conductive part than at the top end of the conductive part.

6. The device of claim 1, wherein the memory cells are not located on the second side surfaces of the conductive part.

7. The device of claim 1, wherein the conductive part is a semiconductor pillar.

8. The device of claim 7, wherein charge accumulation layers included in the respective memory cells are provided between the first wires and the conductive part.

9. The device of claim 8, further comprising second wires electrically connected to the conductive part and provided in a direction intersecting with the first wires, wherein
   a width of the charge accumulation layers in a cross-section in a direction perpendicular to a longitudinal direction of the second wires is larger at the bottom end of the conductive part than at the top end of the conductive part.

10. The device of claim 8, wherein a width of the charge accumulation layers is larger at the bottom end of the conductive part than at the top end of the conductive part, the width of the charge accumulation layers being a width in a longitudinal direction of the first wires.

11. The device of claim 1, wherein
    a pair of the first wires are provided on both sides of the conductive part in the cross-section and extend in a direction perpendicular to the longitudinal direction of the conductive part, and
    a pair of the memory cells are provided on both sides of the conductive part in the cross-section.

* * * * *